US006666916B2

United States Patent
Fellbaum et al.

(10) Patent No.: US 6,666,916 B2
(45) Date of Patent: Dec. 23, 2003

(54) APPARATUS AND METHOD FOR MAKING FREE STANDING DIAMOND

(75) Inventors: Randy D. Fellbaum, Center Barnstead, NH (US); Volker R. Ulbrich, Worcester, MA (US)

(73) Assignee: Saint-Gobain/Norton Industrial Ceramics Corporation, Worcester, MA (US)

(*) Notice: Subject to any disclaimer, the term of this patent is extended or adjusted under 35 U.S.C. 154(b) by 0 days.

(21) Appl. No.: 10/274,016

(22) Filed: Oct. 18, 2002

(65) Prior Publication Data

US 2003/0072877 A1 Apr. 17, 2003

Related U.S. Application Data

(62) Division of application No. 08/388,788, filed on Feb. 15, 1995, now Pat. No. 6,533,869.

(51) Int. Cl.[7] ............................................. C30B 29/04
(52) U.S. Cl. ......................... 117/101; 117/90; 117/94; 117/95; 117/96; 117/106; 117/915; 117/929
(58) Field of Search ................. 117/929, 915, 117/90, 94, 95, 96, 101, 106

(56) References Cited

U.S. PATENT DOCUMENTS

| | | | |
|---|---|---|---|
| 3,934,809 A | 1/1976 | Fox et al. | 249/117 |
| 4,847,063 A | 7/1989 | Smith | 423/445 |
| 5,126,207 A | 6/1992 | Chen et al. | 428/408 |
| 5,204,890 A | 4/1993 | Anno et al. | 378/133 |
| 5,223,158 A | 6/1993 | Lizenby | 249/59 |
| 5,314,652 A | 5/1994 | Simpson et al. | 264/81 |
| 5,349,922 A | 9/1994 | Anthony et al. | 117/204 |
| 5,407,487 A | 4/1995 | Weber et al. | 118/728 |
| 5,762,715 A * | 6/1998 | Patten et al. | 118/730 |
| 5,869,133 A * | 2/1999 | Anthony et al. | 427/249.8 |
| 5,976,206 A * | 11/1999 | Bigelow et al. | 51/307 |
| 6,209,185 B1 * | 4/2001 | Scott | 29/458 |
| 6,319,439 B1 * | 11/2001 | Lee et al. | 264/81 |

FOREIGN PATENT DOCUMENTS

EP 0 442 303 A1 1/1991 ............ C23C/16/26

* cited by examiner

Primary Examiner—Robert Kunemund
(74) Attorney, Agent, or Firm—Gordon & Jacobson, P.C.

(57) ABSTRACT

A mandrel for use in a diamond deposition process has surfaces with different diamond adhesion properties. According to one embodiment, a mandrel is provided and has first and second surfaces on which a diamond film is deposited, with the second surface forming a perimeter around the first surface. The first surface of the mandrel has a first diamond bonding strength which is less than a second diamond bonding strength of the second surface. In an embodiment for forming a cup-shaped diamond film, the mandrel is a titanium nitride (TiN) coated molybdenum (Mo) substrate having a stepped solid cylindrical shape with a central mesa having a side wall or flank. The side wall is etched near the top surface of the mesa to expose a molybdenum band and to form a second surface which bounds the TiN first surface. When the molybdenum band loses efficiency as a result of diamond particles remaining in the molybdenum band after a diamond deposition procedure, a second strip of the TiN coating adjacent to the first strip may be etched or machined to expose a second band of molybdenum. Other embodiments of the invention include machining the molybdenum band on the mesa top surface, machining a stepped molybdenum band, using a separate and detachable molybdenum foil or wire applied to grooves in the mandrel, and forming radial lines or patches on the surface of the mandrel.

16 Claims, 6 Drawing Sheets

APPARATUS AND METHOD FOR MAKING FREE STANDING DIAMOND

This is a divisional of application Ser. No. 08/388,788 filed on Feb. 15, 1995, now U.S. Pat. No. 6,533,869.

BACKGROUND OF THE INVENTION

1. Field of the Invention

This invention relates broadly to diamond film manufacturing. More particularly, this invention relates to an apparatus and method for manufacturing free standing diamond films.

2. State of the Art

Diamond has exceptional hardness, thermal conductivity, electrical insulation and light transmission properties, and is therefore useful in various applications such as cutting tools, heat sinks, insulators, electronic substrate materials, etc. Natural diamond, however, is monocrystalline and limited in size and geometry. As a result, a number of techniques have recently been developed, such as high pressure high temperature deposition (HPHT) and chemical vapor deposition (CVD), for synthesizing and depositing diamond on substrates of various shapes, sizes and materials. The below discussion relates to CVD diamond film deposition.

Synthetic CVD diamond film can be deposited as a thin permanent coating on a substrate, such as on the wear surface of a tool or as an environmentally protective coating. Such films are generally referred to as thin films. Alternatively, a thicker diamond film can be deposited on a substrate and then removed, preferably intact, as a single "free standing" piece for use in applications such as heat sinks, optical windows, and cutting tools. These free standing pieces are usually referred to as thick films.

In the manufacture of thick films, it is convenient to deposit the diamond on a substrate and then allow thermal stresses during cooling to detach the diamond from the substrate. This process eliminates the operation of removing the diamond from the substrate, and allows the substrate to be reused. In general, several considerations must be taken into account when manufacturing free standing diamond films by depositing synthetic diamond on a substrate. A relatively weak bond between the diamond and substrate is essential to ensure that the diamond will easily detach from the substrate. The substrate material and diamond generally have different coefficients of expansion, as well as different molecular and chemical structures, which affects the growth, adhesion, and smoothness of the diamond film. Other factors, such as surface preparation, and deposition parameters will also affect the growth and adherence of the synthetic diamond on the substrate.

Titanium nitride coated molybdenum and other materials having similar properties, such as titanium-zirconium-molybdenum alloys and tungsten, have traditionally been used as a substrate (mandrel) upon which synthetic diamond is to be deposited. These materials are chosen because of their temperature properties including coefficients of expansion, and their machinability. A layer of synthetic diamond can be deposited on a TiN coated molybdenum substrate, such as by CVD, and then released from the substrate after the desired thickness of diamond film is reached. The diamond is deposited on the substrate at a relatively high temperature and, as the diamond and the substrate cool after completion of the diamond deposition, the diamond is released from the substrate as a result of the difference in the coefficient of thermal expansion of the diamond and the substrate materials. Since the outer edges of the substrate cool faster than the inner portions of the substrate, several problems may arise during this procedure. Diamond film may detach from the substrate prematurely, resulting in an incomplete and defective diamond film. Also, upon release of the diamond film from the substrate after deposition, the diamond film tends to crack at the edges and/or break.

SUMMARY OF THE INVENTION

It is therefore an object of the invention to provide a substrate and method for making a free standing diamond film.

It is also an object of the invention to provide a substrate and method for making a free standing diamond film which allows for the more reliable and easy removal of the diamond film from the substrate.

It is a further object of the invention to provide a substrate for making a free standing diamond film which prevents the diamond film from releasing prematurely from the substrate while diamond is being deposited on the apparatus.

It is also an object of the invention to provide a substrate which reduces the cracking/breaking of a diamond film when the diamond releases and is subsequently removed from the substrate.

In accordance with the objects of the invention, which will be discussed in detail below, a mandrel substrate is provided having a surface with varying diamond adhesion properties. In general, it is preferable that the substrate have greater diamond adhesion properties on or near its outer edge, but it may also be desirable to provide an adhesion gradient along the surface of the substrate, depending on the type of diamond being manufactured.

In a first embodiment of the invention for forming a free-standing cup-shaped diamond film, the mandrel is a titanium nitride (TiN) coated molybdenum (Mo) substrate having a stepped solid cylindrical shape with a central mesa having a side wall, or flank. A band is etched or machined around the mesa perimeter on the side wall near the top surface of the mesa to expose the underlying molybdenum and form a second surface which bounds the TiN first surface. The exposed molybdenum exhibits a stronger adhesion to diamond than does the TiN. When the molybdenum band loses efficiency as a result of diamond material remaining in the molybdenum band after a diamond deposition procedure, a second strip of the TiN coating adjacent to the first strip may be machined to expose a second band of molybdenum.

In a second embodiment of the invention for forming a free standing diamond film wafer, the molybdenum band may be etched directly on the top surface of the mesa of the mandrel, resulting in a first circular surface of TiN surrounded by an outer ring of molybdenum forming a second surface. As in the first embodiment, additional adjacent molybdenum bands may be etched as desired after repeated use.

A third embodiment of the invention includes combining aspects of the first and second embodiments. Accordingly, a first molybdenum band is etched on the top of the mesa in a fashion similar to the second embodiment, and a second molybdenum band is etched on the side wall of the mesa as described in the first embodiment. If desired, the top surface and side surface bands may be contiguous. As with the first two embodiments, additional molybdenum bands may be etched to replace used ones.

According to a fourth embodiment of the invention, a separate detachable molybdenum foil, band, or wire that can either be fitted like a collar around the top portion of the mesa of the mandrel or laid in a shallow circular groove on the top or side surface of the mesa is provided. The molybdenum foil or wire can be replaced after each use with a new and clean molybdenum foil or wire, thereby dispensing with the need to further machine the mandrel to expose the underlying molybdenum substrate.

Additional embodiments of the invention include mandrels having a plurality of exposed molybdenum surface areas in the form of stripes or patches on the top surface of the mesa to provide a surface for diamond growth which has a diamond adhesion differential or diamond adhesion gradient.

In accord with the invention, the diamond adhesion properties of the mandrel substrate are influenced by the nature of the material on which the diamond film is deposited and by the relative roughness of the mandrel surface. As explained above, molybdenum has greater diamond adhesion properties that TiN. It will be noted, also, that rough surfaces have greater diamond adhesion properties than smooth surfaces. Therefore, the principles of the invention may also be achieved by varying the roughness/smoothness of the mandrel substrate to effect a diamond adhesion differential or diamond adhesion gradient.

According to the method of the invention, which relates closely to the apparatus, a mesa mandrel is prepared as described above to have a band of exposed molybdenum around the sidewall and a diamond film is deposited on the mandrel of the invention until a desired diamond film thickness is achieved. The mandrel and the diamond film are then cooled. Due to the different coefficients of thermal expansion of the diamond film and the mandrel, the mandrel tends to contract under the diamond and separate from the diamond film. The portion of the mandrel having increased diamond adhesion properties (e.g. the exposed molybdenum band in some cases) causes the diamond to crack in a controlled manner at the boundary of the more adherent and less adherent portions of the mandrel. This can result in a razor clean break in the diamond film around its perimeter.

Additional objects and advantages of the invention will become apparent to those skilled in the art upon reference to the detailed description taken in conjunction with the provided figures.

DETAILED DESCRIPTION OF THE PREFERRED EMBODIMENT

Figure 2:
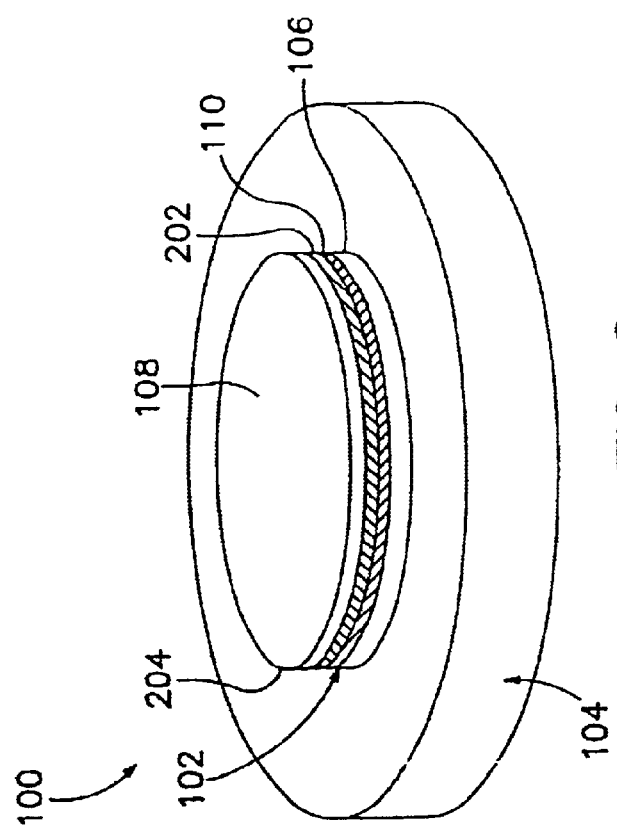
FIG. 2 is a schematic perspective view of the embodiment of FIG. 1 after use, with a first molybdenum side wall band containing diamond particles and a second, contiguous molybdenum side band.
Figure 1:
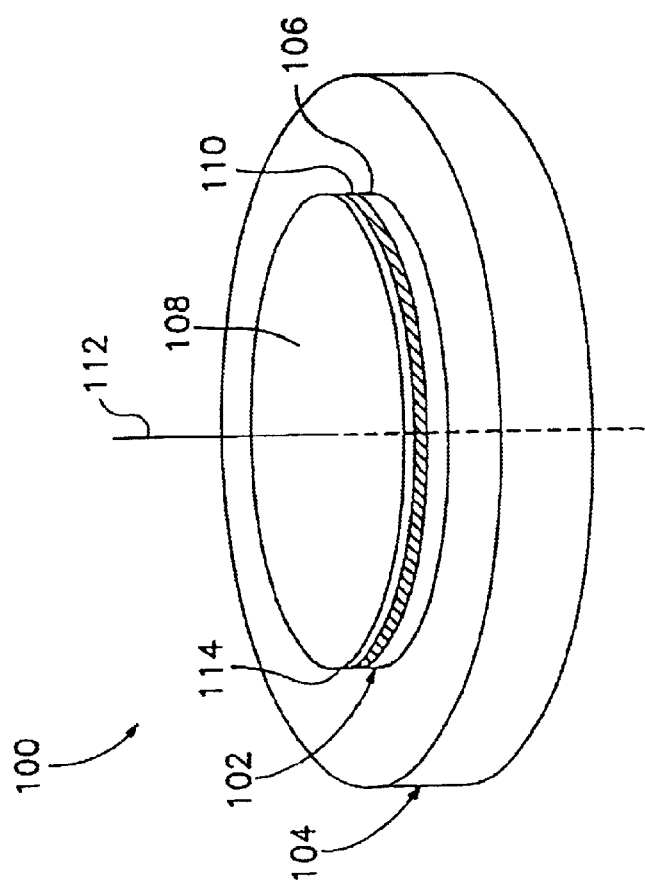
FIG. 1 is a schematic perspective view of a first embodiment of the invention having a stepped cylindrical mandrel with a molybdenum side wall band.

Turning now to FIGS. 1 and 2, a first embodiment of the mandrel 100 of the invention is shown. The mandrel 100 generally comprises a titanium nitride (TiN) coated molybdenum (Mo) substrate having a stepped solid cylindrical shape with a central mesa 102 and a base 104. The central mesa 102 further includes a side wall or flank 106 having a height of approximately 0.250" (6 mm), and a circular top surface 108 having a diameter of approximately 3–4.5" (75–113 mm). The thickness of the TiN coating is preferably in the 0.2 to 2 microns range. An approximately 0.125" (3 mm) wide strip of TiN coating is etched or machined off the side wall 106 of the mesa 102 to expose the underlying molybdenum substrate. As a result, an indented molybdenum band 110 is formed on the side wall 106 and near the top surface 108 of the mesa 102. The molybdenum band 110 is preferably approximately 0.2" (5 mm) from the mesa face 108, and has the same central axis 112 as the mesa 102. The molybdenum band 110 forms a second surface for receiving a CVD diamond film, while the top surface 108 and the portion of the mesa 102 between the top surface 108 and the molybdenum band 114 form a first surface for receiving a CVD diamond film. The base 104 of the mandrel 102 has a diameter of approximately 7" (175 mm) and is preferably attached to a rotating cooling device. Upon depositing a diamond film on the mandrel 100, the portion of the film deposited on the molybdenum band 110 will more strongly adhere to the mandrel 100 than the film portion deposited on the TiN coated surface of the mandrel 100, due to the different adhesion properties of TiN and molybdenum. As described in further detail below in the method of the invention, this difference in adhesion results in overall better diamond growth rates on the mandrel 100 as well as higher quality free standing diamond films. In particular, the problems of flaking, premature release and cracking associated with conventional mandrels are significantly reduced when using the banded mandrel 100 of the invention.

According to a preferred aspect of the first embodiment of the mandrel of the invention, the surface area of the mesa portion bounded by the molybdenum band 114 is made larger than necessary, such that an additional strip of TiN contiguous with the molybdenum band 110 and closer to the top surface 108 of the mesa 102 can be machined to form a second molybdenum band 202 as illustrated in FIG. 2. This is desirable, as the original molybdenum band 110 tends to retain diamond material after the free standing diamond film is removed from the mandrel 100, thereby losing some of its adhesive properties. As a result, the original molybdenum band 110 would have to be thoroughly cleaned between each use of the mandrel 100 in a diamond deposition procedure. This cleaning can be difficult, time consuming, and expensive considering the properties of diamond as discussed above. It is therefore a preferred aspect of the invention to machine a second molybdenum band 202 adjacent to and substantially the same size as the first molybdenum band 110, once the first band 110 has lost its diamond adhesion properties. The second molybdenum band 202 is closer to the top surface 108 of the mesa 102 than the original band 110, such that the deposited diamond film (not shown) on the bounded area of the mesa 204 is not discontinued by the original band 110. It will be appreciated that additional inwardly contiguous bands may be etched as needed, for as long as there is sufficient side wall bounded surface area. Once insufficient surface area remains for the machining of additional molybdenum bands, the machined surface of the mandrel 100 can be recoated with another layer of TiN and a new first molybdenum band (not shown) may be machined. In forming the new first molybdenum band, it is important to remove any molybdenum substrate containing diamond impurities from prior uses, in addition to removing the TiN strip. Additional molybdenum bands may subsequently be machined as needed in the manner described above, and the process continued.

Figure 3:
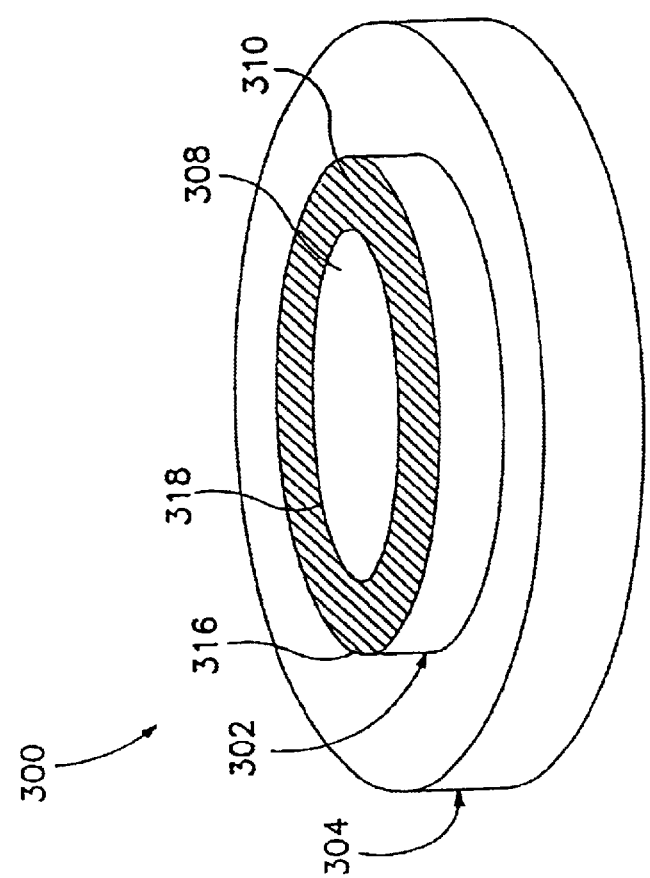
FIG. 3 is a schematic perspective view of a second embodiment of the invention having a stepped cylindrical mandrel with a molybdenum top surface band.

FIG. 3 shows a second embodiment of the mandrel 300 of the invention. The second embodiment is substantially similar in shape and size to the first embodiment, except that in the second embodiment the molybdenum band 310 forms a planar ring located on the top surface 308 of the mesa 302 of the mandrel 300. The outer radius 316 of the molybdenum band 310 coincides with the radius of the cylindrical mesa 302, and the inner radius 318 is preferably approximately 0.0625" (1.5 mm) less than the outer radius, forming a band which is approximately 0.125" (3 mm) wide. The molybdenum band/ring 310 of the second embodiment is etched by removing a strip of TiN in a fashion similar to that used in the first embodiment to expose the underlying molybdenum.

Figure 4:
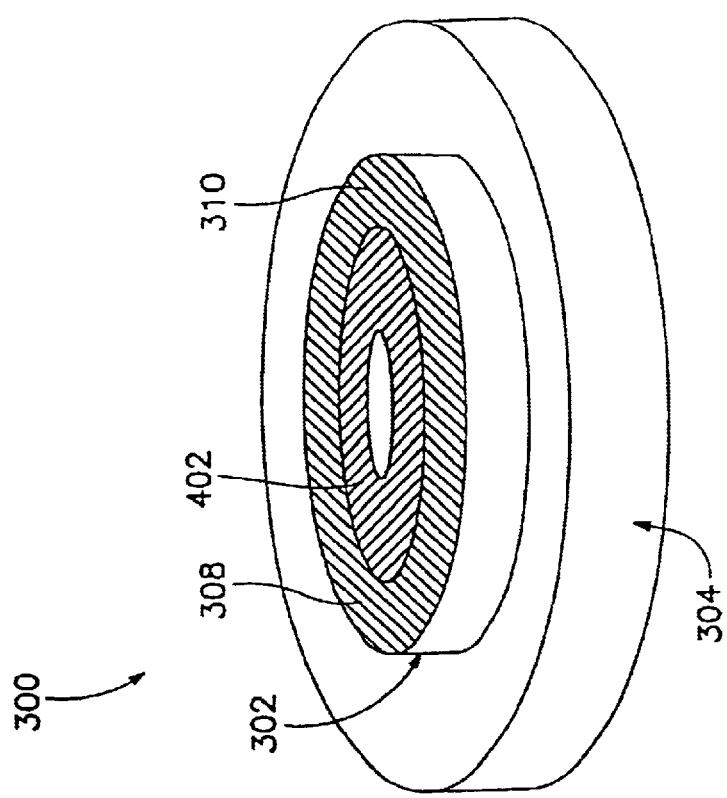
FIG. 4 is a perspective view of the embodiment of FIG. 3 after multiple uses and machining, with a first molybdenum top band containing diamond particles and a second, contiguous molybdenum top band.

As with the first embodiment of the mandrel 100, an additional contiguous and inner concentric band of molybdenum 402 may be etched on the mesa 302 top surface 308 as shown in FIG. 4 when the first molybdenum band 310 is no longer sufficiently adhesive due to the presence of diamond particle deposits. This process may be used several times until the TiN area of the surface becomes too small for the desired diamond film size, at which point the entire mesa 302 surface of the mandrel 300 can be recoated with another layer of TiN and a new first molybdenum band machined as described above.

Figure 5:
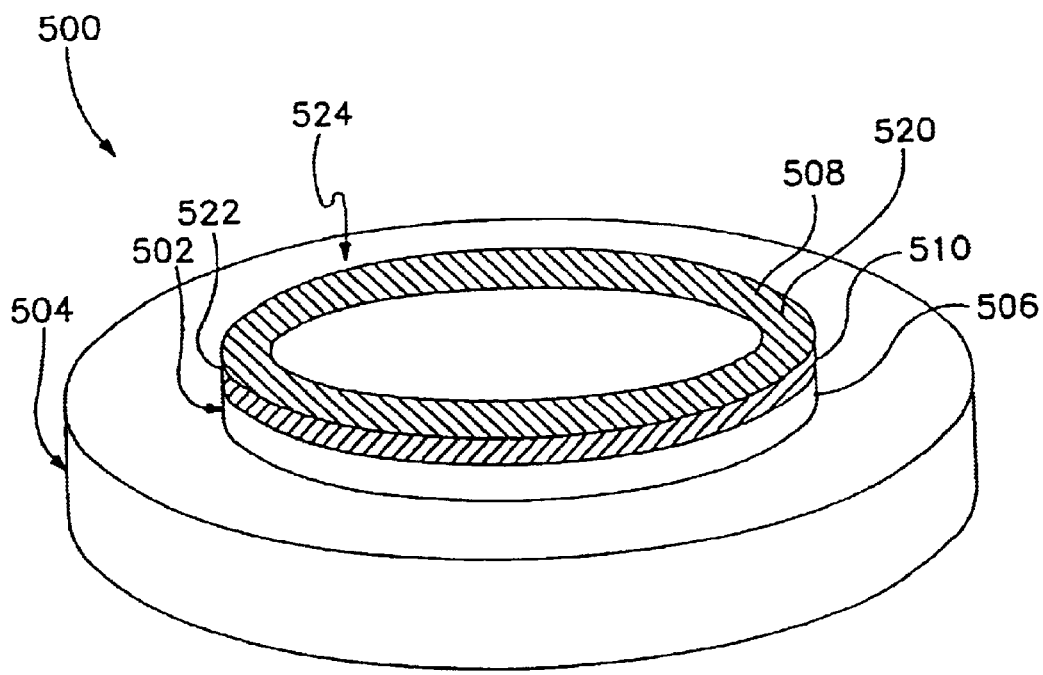
FIG. 5 is a perspective view of a third embodiment of the invention having a stepped cylindrical mandrel with a molybdenum top surface and side wall band.

Referring now to FIG. 5, a third embodiment of the mandrel 500 of the invention is shown. The third embodiment 500 is substantially similar to the first embodiment of the mandrel in that it includes a titanium nitride coated molybdenum substrate having a stepped solid cylindrical shape with a central mesa 502 and a base 504. The central mesa 502 further includes a side wall or flank 506, and a circular top surface 508. However, the third embodiment of the mandrel 500 incorporates aspects of both the first and second embodiments 100, 300 and is provided with two etched molybdenum bands 510, 520. A first molybdenum band 510 is etched on the side wall 506 of the mesa 502, in a similar fashion to the first embodiment (see FIG. 1), except that the top portion 522 of the band 510 is flush with the top surface 508 of the mesa 502. A second molybdenum band 520 is etched on the top surface 508 of the mesa 502 in a manner similar to the second embodiment 300 (see FIG. 3). It will be appreciated that the second molybdenum band 520 extends from the top portion 522 of the first band 510 forming one step-shaped contiguous molybdenum region 524 on which the edges of a diamond film will be deposited. As in the first two embodiments of the mandrel of the invention 100, 300, additional molybdenum bands may be machined for prolonged use of the mandrel 500 by removing strips of TiN coating that are contiguous and inwardly concentric to the second band 520 thereby providing fresh Mo surfaces to which the diamond can adhere.

Figure 6:
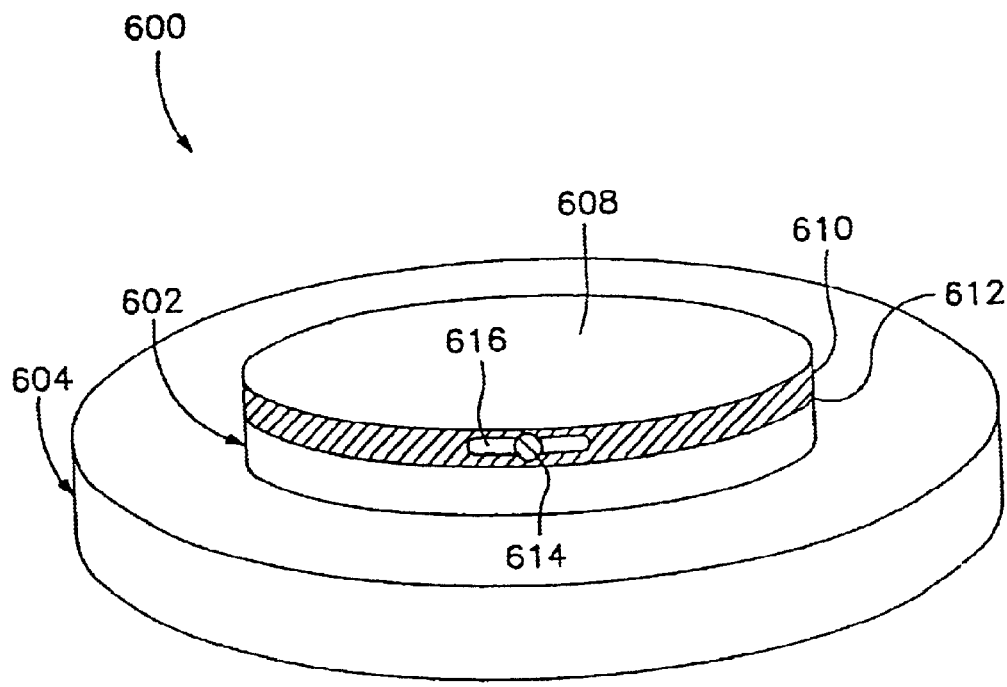
FIG. 6 is a perspective view of a fourth embodiment of the invention having a stepped cylindrical mandrel with a removable molybdenum side wall band.
Figure 7:
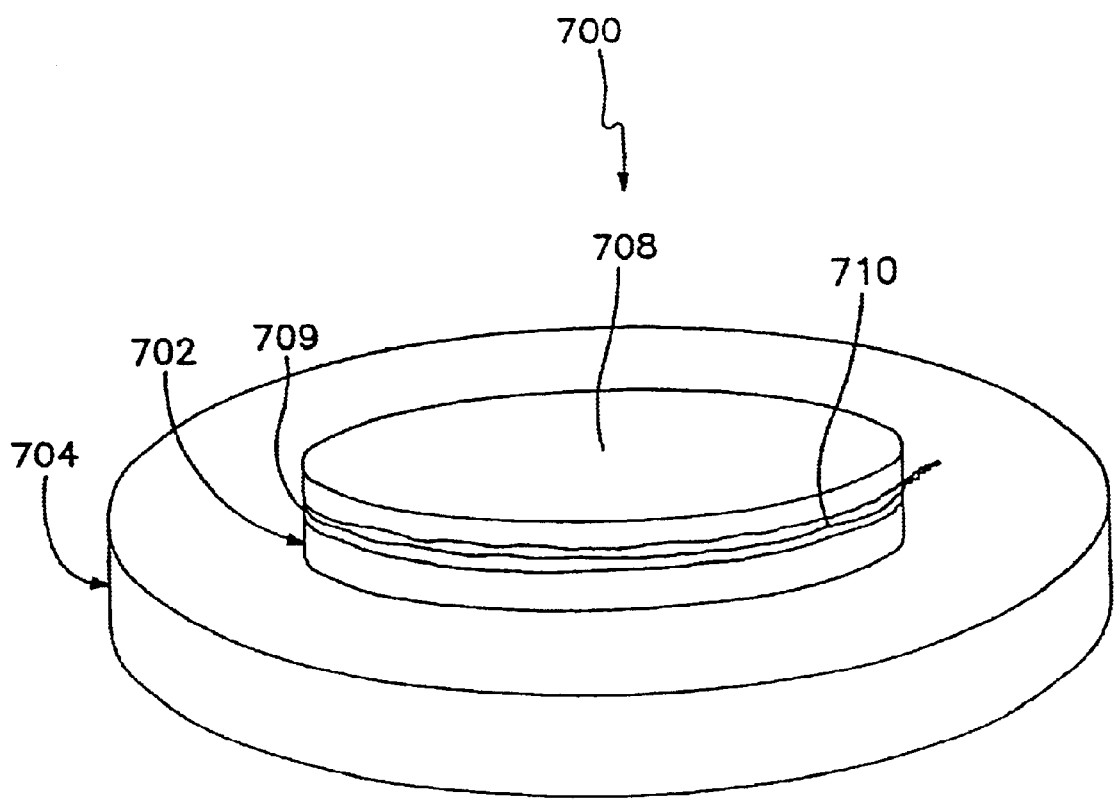
FIG. 7 is a perspective view of a fifth embodiment of the invention having a stepped cylindrical mandrel with a circular top groove and a removable molybdenum band.

Turning to FIGS. 6 and 7, additional alternative embodiments of the mandrel 600, 700 of the invention are shown. The fourth and fifth embodiments of the mandrel 600, 700 of the invention are similar to the previous embodiments, except that the molybdenum bands 610, 710 of the fourth 600 and fifth 700 embodiments are not formed by removing the TiN from the mandrels 600, 700, but rather are separate and removable foils, strips or wires which are applied to the mandrels 600, 700. In particular, the fourth embodiment 600 uses a molybdenum foil collar 610 which is secured around and flush with the top surface 608 of the mesa 602 of the mandrel 600. In this manner, the foil collar 610 can be removed following each use of the mandrel 600 and replaced with a clean molybdenum collar. A shoulder may be formed in the upper side wall of the mesa 602 to accept the collar 610. Locking means for the collar 610 may also be provided. For example, as shown in FIG. 6, the mandrel may be provided with a shoulder 612 onto which the collar 610 fits flush around the mesa. One or more screws 614 may be provided on the mandrel for fixing the collar 610 in place on the mandrel.

The fifth embodiment, as shown in FIG. 7, includes a shallow circular groove 709 on the side of the mesa 702 of the mandrel 700 in which a molybdenum wire 710 is inserted. The groove 709 is sufficiently deep such that the wire 710 may be wound several times around the mesa and securely fastened to the mesa by twisting the ends of the wire together. It will be appreciated that the ring of molybdenum wire 710 can be removed after each use of the mandrel 700, and replaced with a new clean molybdenum wire.

Figure 8:
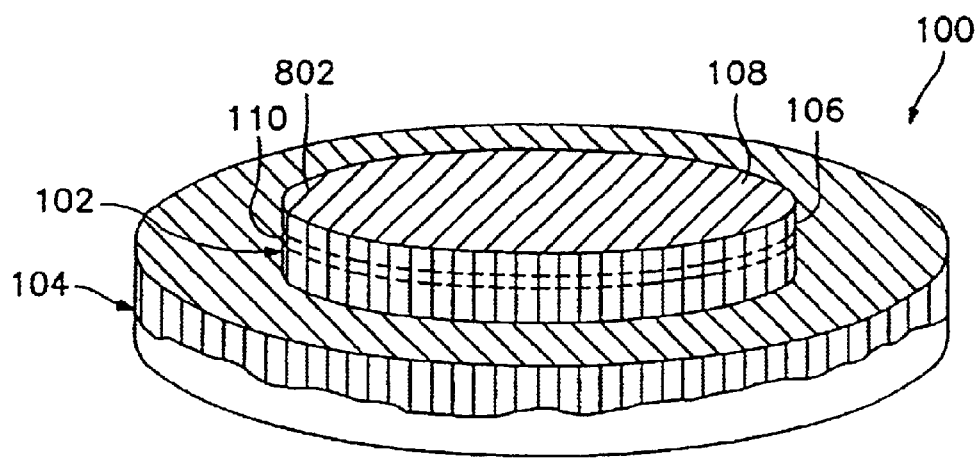
FIG. 8 is a perspective view of a mandrel according to the invention after a diamond film is deposited thereon.
Figure 9:
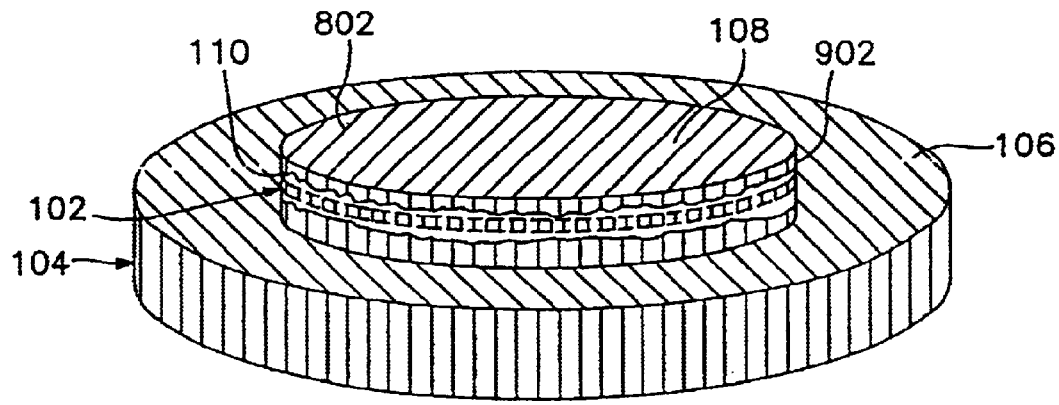
FIG. 9 is a perspective view of a the mandrel of FIG. 8 with a diamond film partially separated from the mandrel.
Figure 10:
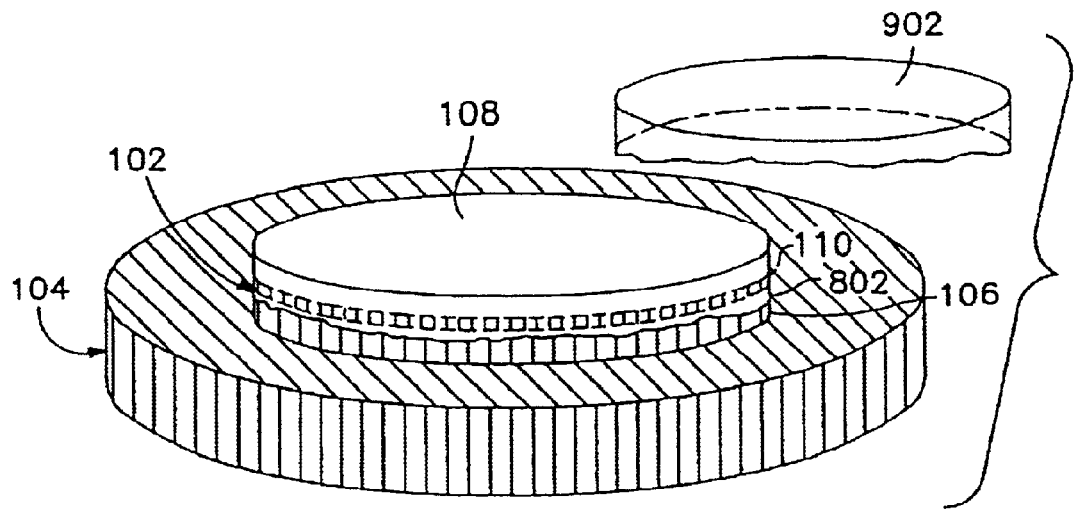
FIG. 10 is a perspective view of a the mandrel of FIG. 9 with a free standing diamond film removed from the mandrel.

Turning now to FIGS. 8–10, a method of making free standing diamond films using the mandrel 100 of the invention is shown. In particular, a mandrel 100 is prepared as described above. An approximately 0.021" (0.5 mm) thick film of diamond 802 is deposited on the mandrel 100 by any known diamond deposition technique, such as CVD. To achieve uniform deposition for the desired wafer size, uniform temperature gradients must be maintained. Using a larger substrate mass in the reactor helps provide this uniformity. Excess diamond film which is deposited on the larger substrate may be used for other applications such as grit. The diamond film adheres with greater strength to the molybdenum band surface of the mandrel than it does to the TiN surface. It will therefore be appreciated that the portion of the diamond film deposited on the molybdenum band will act as an anchor for the outer edge of the diamond film on the bounded portion 114 of the mesa 102. In this manner, several of the problems traditionally associated with fabricating free standing diamond films are resolved. The diamond film coating does not flake off or prematurely release from the mandrel during deposition because of the extra mechanical and chemical adherence the molybdenum provides for the diamond film. In addition, the lifting is reduced as the molybdenum band 110 prevents translation of vertical pressure from the base 104 to the bounded area 114 of the mesa 102.

Once the diamond film and the substrate are allowed to cool, a portion or wafer 902 of the diamond film 802 covering the bounded mesa area 114 is removed from the mandrel by any known technique in the art. Typically, the stresses caused during deposition will "pop" the wafer 902 free from the mandrel 100 at the boundary between the TiN surface 108 and the molybdenum band 110. The different adhesive strengths of molybdenum and TiN result in fewer cracks and breaks in the diamond film upon release from the mandrel 100. The resulting free standing diamond is cup shaped with edges coinciding with the molybdenum band as shown in FIG. 10. After using the mandrel as described, the molybdenum band contains diamond particles after use, and thus becomes less adhesive. In order to make the most effective use of the mandrel in a second deposition procedure, a second molybdenum band may be provided as described above.

Figure 11:
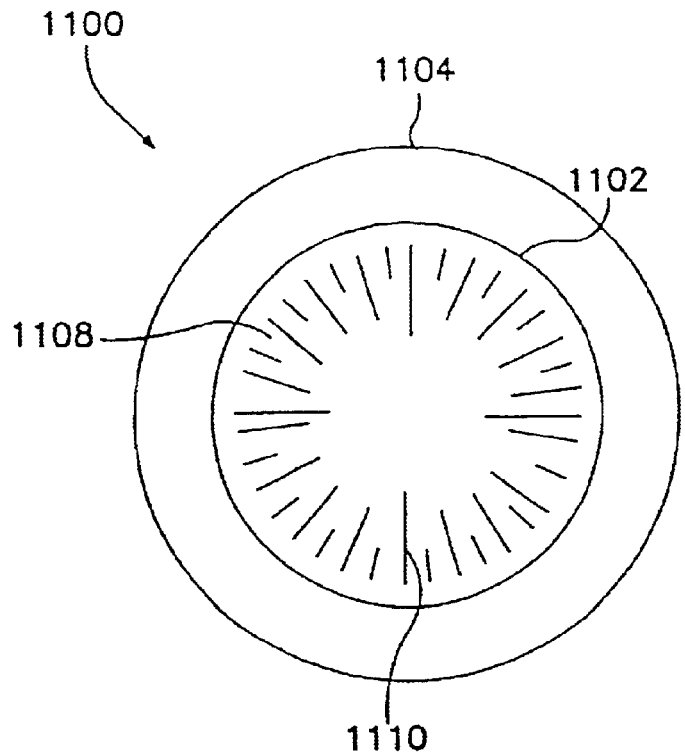
FIG. 11 is a plan view of a sixth embodiment of the invention having a stepped cylindrical mandrel with molybdenum stripes on the mesa top surface.
Figure 12:
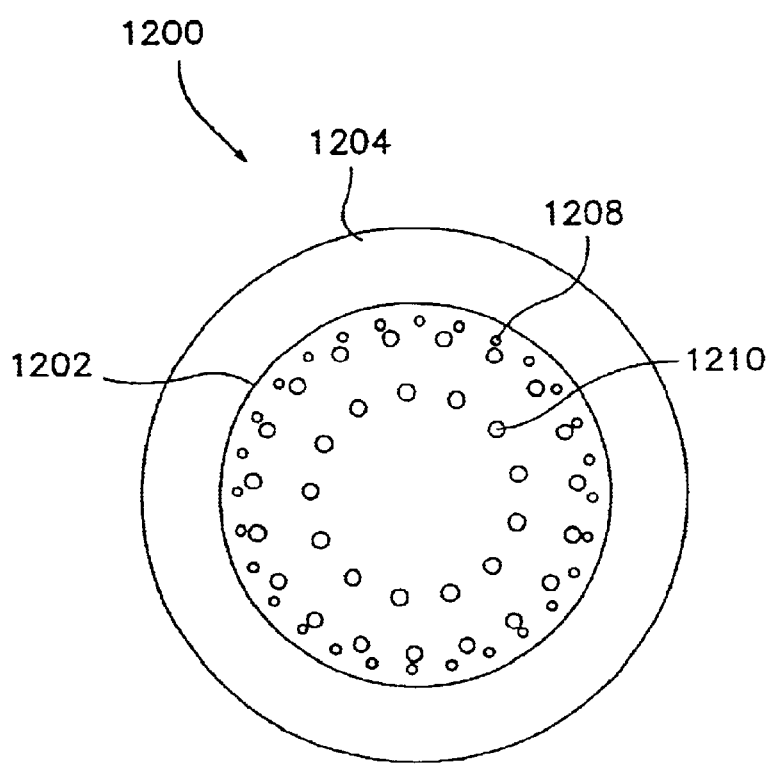
FIG. 12 is a plan view of a seventh embodiment of the invention having a stepped cylindrical mandrel with molybdenum patches on the mesa top surface.

Referring to FIGS. 11 and 12, sixth and seventh embodiments of the mandrel of the invention for making free-standing diamond are shown. FIG. 11 is a plan view of the sixth embodiment 1100 of the mandrel of the invention, showing the top surface 1108 of the mesa 1102 and the mandrel step 1104. Multiple molybdenum stripes 1110 extending from the center of the mesa top surface 1108 and having varying length are machined on the mesa top surface 1108 by removing strips of the TiN coating. The TiN strips are removed in a manner similar to that described above for the banded mandrels of the invention. As with the previous embodiments, upon depositing a diamond film on the mandrel 1100, the portion of the film deposited on the molybdenum stripes 1110 will more strongly adhere to the mandrel 1100 than the film portion deposited on the TiN coated surface of the mandrel 1100, due to the different adhesion properties of TiN and molybdenum. Unlike the previous embodiments, however, the molybdenum stripes 1110 of the sixth embodiment are thinner and shorter than the molybdenum bands disclosed in the first five embodiments, and do not result in the breaking/separation of the diamond film after cooling. The stripes 1110 primarily provide a better surface for diamond growth and minimize the problems of flaking, premature release and cracking associated with the fabrication of free-standing diamonds using diamond deposition. The number, length, and width of the stripes may be varied to provide an adhesion differential or adhesion gradient across the surface of the mesa. The seventh embodiment of the mandrel of the invention is illustrated in FIG. 12 and is substantially similar to FIG. 11, except that instead of longitudinal molybdenum stripes, small molybdenum patches 1210 are machined into the top surface 1208 of the mesa 1202 by removing small disks of the TiN coating. The resulting mesa top surface 1208 provides similar diamond growth and adherence properties to those found in the sixth embodiment. The size and number of patches may be varied to provide an adhesion differential or adhesion gradient across the surface of the mesa.

There have been described and illustrated herein several embodiments of a method and apparatus for manufacturing free standing diamond films. While particular embodiments of the invention have been described, it is not intended that the invention be limited thereto, as it is intended that the invention be as broad in scope as the art will allow and that the specification be read likewise. Thus, while particular mandrel shapes have been disclosed, it will be appreciated that other mandrels may be used as well. While a generally stepped cylindrical mandrel has been disclosed, a non-stepped cylindrical mandrel or a stepped cubical mandrel may also be used, as well as other geometries such as hexagonal or octal. Furthermore, while particular types of mandrel substrates and substrate coatings have been disclosed, it will be understood that other mandrel substrates and substrate coatings can be used. For example, and not by way of limitation, while a titanium nitride coated molybdenum mandrel substrate has been disclosed, a titanium carbonitride coated molybdenum mandrel substrate may also be used, as well as a tungsten or titanium-zirconium-molybdenum alloy mandrel substrate. Also, while a circular ring shaped molybdenum band is preferred, it will be recognized that the molybdenum may have almost any ring shape. Also while molybdenum is used to band the mandrel, other materials such as tungsten or other adherent materials on which diamond will grow may be used. Moreover, while particular configurations have been disclosed in reference to the dimensions of the mandrel and molybdenum band, as well as the location of the molybdenum band on the mandrel, it will be appreciated that other configurations could be used as well. While one of the disclosed embodiments involves etching or machining the mandrel to remove TiN and expose Mo, it is possible to provide a Mo mandrel which has a ridge which is masked before coating the mandrel with TiN. The masked ridge will not be coated and when the mask is removed the second Mo surface will be exposed. In addition, the adhesion differential or adhesion gradient provided on the mandrel according to the invention may be created by roughening the surface of the mandrel so that portions of the mandrel have a more or less rough surface. Furthermore, while a method of manufacturing free standing diamond films using a particular mandrel has been disclosed, it will be understood that other methods using different mandrels can be similarly used and will provide different end products. It will therefore be appreciated by those skilled in the art that yet other modifications could be made to the provided invention without deviating from its spirit and scope as so claimed.

What is claimed is:

1. A method of making a free standing diamond, comprising:

a) providing a mandrel having first and second deposition surfaces on which diamond is to be deposited as a film, said first surface having a first diamond bonding strength and said second surface having a second diamond bonding strength greater than said first diamond bonding strength;

b) depositing diamond on the first and second surfaces of the mandrel to form a diamond film; and c) removing said diamond film from the mandrel.

2. A method according to claim 1, wherein:

said second surface is formed as a perimeter around said first surface.

3. A method according to claim 1, wherein:

said second surface is formed as a plurality of radial lines in said first surface.

4. A method according to claim 1, wherein:

said second surface is formed as a plurality of patches in said first surface.

5. A method according to claim 1, wherein:

said step of providing a mandrel includes providing a mandrel with a titanium nitride first surface and a molybdenum second surface.

6. A method according to claim 1, wherein:

said step of providing a mandrel includes providing a circular mandrel with a mandrel diameter and said first surface forms a circle with a diameter smaller than said mandrel diameter, and said second surface forms an annular band around said first surface.

7. A method according to claim 1, wherein:

said step of providing a mandrel includes providing a cylindrical mandrel with a side wall and a top surface having a mandrel diameter, said first surface forms a circle with a diameter smaller than said mandrel diameter, and said second surface forms a circular band around said side wall.

8. A method according to claim 1, wherein:

said step of providing a mandrel includes providing a stepped cylindrical mandrel having a mesa portion and a base portion.

9. A method according to claim 8, wherein:

said step of providing a mandrel includes providing a mandrel such that said mesa has a top surface and a flank, said second surface is a band forming a perimeter around said flank and said first surface is an area of said mesa bounded by said second surface and including said top surface of said mesa.

10. A method according to claim 8, wherein:

said step of providing a mandrel includes providing a mandrel such that said mesa has a top surface and a flank, said second surface is an annular band forming a perimeter around said top surface and said first surface is an area of said top surface of said mesa bounded by said second surface.

11. A method according to claim 8, wherein:

said step of providing a mandrel includes providing a mandrel such that said mesa has a top surface and a flank, said second surface is a stepped band forming a perimeter around said top surface and said flank, and said first surface is an area of said top surface of said mesa bounded by said second surface.

12. A method according to claim 8, wherein:

said step of providing a mandrel includes providing a titanium nitride coated molybdenum substrate mandrel, said second surface is an exposed portion of said underlying molybdenum made by removing a strip of said titanium nitride, and said first surface is a portion of said titanium nitride bounded by said second surface.

13. A method of making a mandrel for use in making a free standing diamond where diamond will be deposited on a film on said mandrel, said method comprising:

a) providing a first deposition surface on a substrate, said first surface having a first diamond bonding strength; and b) providing a second deposition surface on said substrate, said second surface having a second diamond bonding strength.

14. A method according to claim 13, wherein:

said second surface is provided around a perimeter of said first surface.

15. A method according to claim 13, wherein:

said second surface is provided as a plurality of radial lines on said first surface.

16. A method according to claim 13, wherein:

said second surface is provided as a plurality of patches on said first surface.

\* \* \* \* \*